(12) United States Patent
Eldridge

(10) Patent No.: US 6,461,931 B1
(45) Date of Patent: Oct. 8, 2002

(54) THIN DIELECTRIC FILMS FOR DRAM STORAGE CAPACITORS

(75) Inventor: Jerome M. Eldridge, Los Gatos, CA (US)

(73) Assignee: Micron Technology, Inc., Boise, ID (US)

( * ) Notice: Subject to any disclaimer, the term of this patent is extended or adjusted under 35 U.S.C. 154(b) by 10 days.

(21) Appl. No.: 09/651,380

(22) Filed: Aug. 29, 2000

(51) Int. Cl.$^7$ ................................................ H01L 21/20
(52) U.S. Cl. ............................ 438/398; 438/4; 438/608
(58) Field of Search .................. 438/398, 396, 438/785, 4, 608

(56) References Cited

U.S. PATENT DOCUMENTS

| | | | |
|---|---|---|---|
| 4,519,851 A | * | 5/1985 | Perry et al. ................. 148/6.31 |
| 5,480,748 A | * | 1/1996 | Bakeman, Jr. et al. ......... 430/11 |
| 5,663,088 A | | 9/1997 | Sandhu et al. |
| 5,686,748 A | | 11/1997 | Thakur et al. |
| 5,814,852 A | | 9/1998 | Sandhu et al. |
| 5,916,365 A | * | 6/1999 | Sherman ...................... 117/92 |
| 5,977,581 A | | 11/1999 | Thakur et al. |
| 6,008,086 A | | 12/1999 | Schuegraf et al. |
| 6,017,789 A | | 1/2000 | Sandhu et al. |
| 6,025,257 A | * | 2/2000 | Jeon ............................ 438/608 |
| 6,124,769 A | * | 9/2000 | Igarashi et al. ............. 333/172 |
| 2001/0024387 A1 | * | 9/2001 | Raaijmakers et al. ....... 365/200 |

* cited by examiner

*Primary Examiner*—Caridad Everhart
(74) *Attorney, Agent, or Firm*—Fogg Slifer Polglaze Leffert & Jay P.A.

(57) ABSTRACT

Methods for forming multiple dielectric layers at low temperatures include forming a number of metallic layers on a substrate and oxidizing the metallic layers to different dielectric oxides. Oxidation is performed one layer at a time, or all layers together. Dielectric layers thus formed have multiple different oxides in layers, reducing defects, providing high capacitance, and low leakage currents.

46 Claims, 7 Drawing Sheets

"CRACK"

Fig. 5A

KEY
Si
Ta
Ta$_2$O$_5$
Si$_3$N$_4$
SiO$_2$

| ESTIMATED CAPACITANCES | | |
|---|---|---|
| OXIDE THICKNESS, ÅNGSTROM | | TOTAL CAPACITANCE |
| $Ta_2O_5$ | $SrTiO_3$ | fF/micrometer$^2$ |
| 80 | 0 | 56 |
| 100 | 0 | 45 |
| 120 | 0 | 37 |
| 40 | 40 | 75 |
| 50 | 50 | 60 |
| 60 | 60 | 49 |
| 70 | 70 | 43 |

THIN DIELECTRIC FILMS FOR DRAM STORAGE CAPACITORS

FIELD

The present invention relates generally to integrated capacitors such as are formed in dynamic random access memory (DRAM) arrays, and more particularly to the dielectric films which separate the two capacitor plates.

BACKGROUND

Figure 1:
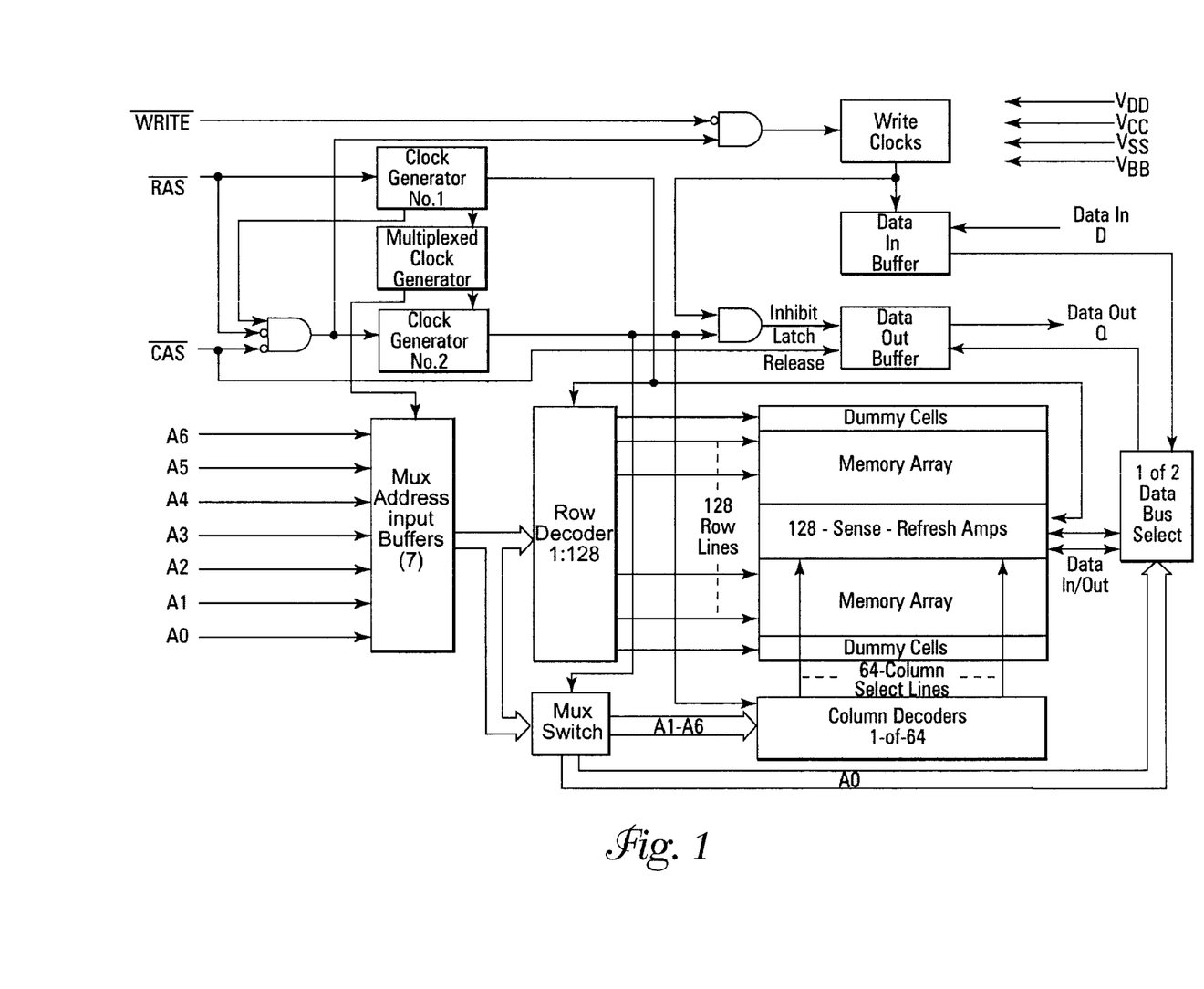
FIG. 1 is a block diagram of a DRAM chip on which embodiments of the present invention are used.

Dynamic random access memory (DRAM) is a type of memory which must be read and refreshed periodically and typically uses a cell structure of one transistor and one capacitor. Despite the disadvantage of periodically refreshing the cells, the cost, flexibility, and density of this memory type has made it a very popular form of semiconductor memory. FIG. 1 shows a block diagram of an early DRAM architecture.

As device sizes continue to shrink for integrated circuits, newer materials and new methods of forming old materials are increasingly necessary to meet the demands placed on the system. For instance, charge storage cells for 1–4 Gb DRAMs require capacitances on the order of 25 to 30 fF in order to make the cell detectable over the bit line capacitance. Capacitance can be increased by using a thinner capacitor dielectric, using a high-k dielectric (i.e., one with a DC dielectric constant greater than 10), or by increasing the capacitor size, with high-k dielectrics being particularly desirable at this stage. Current DRAM capacitors commonly use silicon dioxide/silicon nitride (ON) dielectrics which have been intensely investigated and optimized to near their practical performance limit. For example, silicon dioxide has a dielectric constant near 3.9, while the dielectric constant of silicon nitride is about 7.0.

Alternative dielectrics are being investigated to meet the need for increased capacitance, including perovskite structures such as barium strontium titanate (BST) or lead zirconium titanium (PZT). However, although these compounds have very high dielectric constants, there is still much to be learned about fabricating capacitors with them, and many current processes that will have to be changed to use these materials.

Some DRAM manufacturers have gone to deposition of tantalum pentoxide ($Ta_2O_5$), which has a dielectric constant of 20–30, depending on how it is prepared. This is not as high as the perovskites, but is a significant improvement over ON dielectrics. Additionally, tantalum pentoxide does not require the major changes in the process flow that other dielectric materials do.

Thin oxides, such as for capacitor dielectrics, are generally deposited, e.g., by metal oxide chemical vapor deposition (MOCVD) or by sputter deposition of a metal in the presence of an oxidizing medium (with the exception of oxides grown from silicon, which may be either grown or deposited). In this situation, however, the composition of the oxide across the thickness of oxide is not homogeneous. When oxidizing bulk metal, such as tantalum, niobium, and the like, unless the metal is completely oxidized, there will be present a sequence of oxides, with the most oxygen rich oxide on the outermost surface on in to the most oxygen lean oxide at the substrate, forming layers of various compositions. All the oxides will form, and will be found looking at a cross section.

When oxides are formed on clean metal surfaces at so-called "low temperatures" (up to roughly 200–300° C. or so, depending on the metal), oxidation rates are initially high (on the order of angstroms/minute) but decrease markedly as the oxides thicken to reach a so-called "limiting thickness" value ($X_L$) where the rate is about an Angstrom/day. Depending on the metal, temperature, oxygen pressure, etc., $X_L$ values vary from about 10 to perhaps 200 Angstrom. In this growth regime, the oxide thickness x increases logarithmically with time t:

$$X=a(\ln t)+b$$

where b is a constant, depending on the metal, its morphology, and other conditions. In a few cases, the data fit slightly better to a:

$$x^{-1}-\ln t$$

dependence. Both time dependencies result from the dominating presence of a large ($>10^6$ volts/cm) electric field across the growing oxide layer. Such fields promote oxidation by lowering activation energies of mobile ion (typically $O^{-2}$) diffusion and arise from electronegativity differences between surface oxygen and unreacted metal. Such differences cause electrons to tunnel from the metal through the oxide to the electrophilic, chemisorbed oxygen moieties on the outer surface. The resultant charge separation over a very small distance produces fields which can substantially enhance the oxidation process at temperatures too low to permit very substantial thermally-induced diffusion. However, electron tunneling diminishes exponentially with increasing x, causing large reductions in the field and dx/dt as x approaches $X_L$. For a given metal, higher oxidation temperatures will increase both dx/dt and the ultimate $X_L$ values realized in the temperature regime where logarithmic growth kinetics are still operative.

However, the total layer construction will typically not be limited to a purely stoichiometric top layer over a purely metallic underlayer. The diffusion of oxygen will normally cause an intermediate region to exist between two such layers. The intermediate region will have a composition which is less than fully oxidized, i.e., which has a fraction of oxygen which is smaller than that of the stoichiometric layer. Such a composition is often referred to as a "suboxide."

For example, where tantalum is oxidized, the outer layer will be $Ta_2O_5$, but suboxides containing less oxygen will form under this outer layer. Over time, some of the pentoxide will be converted to a suboxide, which degrades the performance of the device.

Oxides need to be crystallized to get maximum dielectric constant. Oxides formed by SD or MOCVD require heating in oxygen to temperatures on the order of 700–800 degrees C. to form. When oxides are made by MOCVD, carbon contaminants are introduced and need to be burned out. The drawback to this is that while such treatments do crystallize the oxide, they also cause oxidation of the silicon substrate, which is unwanted.

There are problems with MOCVD. Maximum oxidation states are typically not achieved in MOCVD processes due to a number of factors including the flow of gasses, gradients, the amount of oxygen used, and the like. Therefore, there are nonuniformities introduced in the process. These nonuniformities include chemical impurities, carbon contamination, and the like. Fragments of the reaction process get into the deposited oxides.

SUMMARY

In one embodiment, a method of forming a dielectric layer includes depositing a first metallic layer on a substrate, and oxidizing the metallic layer to form a first dielectric oxide. A second metallic layer is deposited on the first oxidized layer, and the second metallic layer is oxidized to form a second dielectric oxide different from the first dielectric oxide. In another embodiment, both metallic layers are formed before oxidation.

In another embodiment, a dielectric layer includes an ultrathin partially oxidized layer, a first stoichiometric dielectric oxide layer, and a second stoichiometric dielectric oxide layer of different composition than the first dielectric oxide layer, wherein the first and the second oxide layers are formed in a single oxidation process.

Other embodiments are described and claimed.

DETAILED DESCRIPTION

In the following detailed description of the embodiments, reference is made to the accompanying drawings which form a part hereof, and in which is shown by way of illustration specific embodiments in which the invention may be practiced. It is to be understood that other embodiments may be utilized and structural changes may be made without departing from the scope of the present invention.

Figure 2:
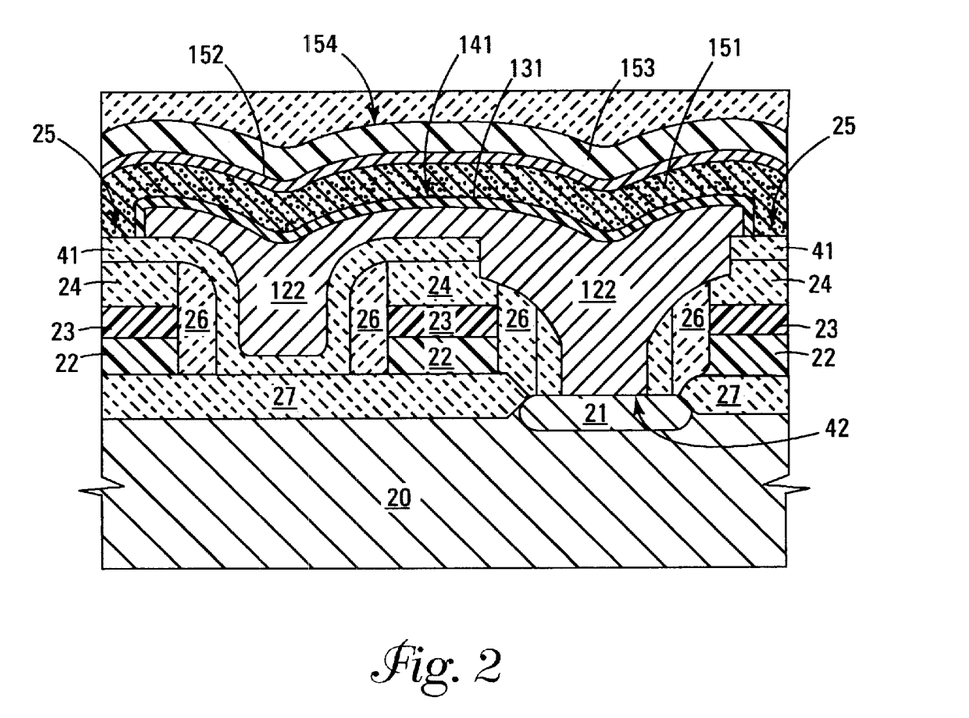
FIG. 2 shows a capacitor which can be used with the disclosed dielectric films.

U.S. Pat. No. 5,262,343, which is commonly owned by the assignee of this application and which is hereby incorporated by reference, demonstrates a method of making a stacked capacitor. This method can, for example, advantageously be modified to use the disclosed dielectric material. FIG. 2, which is taken from that patent, shows word line 25 being composed of layers of polysilicon 22, silicide 23, and dielectric 24, with side wall spacers of a dielectric material 26. The capacitor is formed of a conductive layer of polysilicon 122 overlain by silicide 131 to form the lower plate, a conductive layer of metal 152 overlain by silicide 153 to form the upper plate, with the two plates being separated by a layer of dielectric 151.

Most metals, including tantalum, niobium, and alkaline earth, as well as the refractory metals, oxidize with a logarithmic time dependence at low temperatures, obeying the equation x=a(lnt)+b up to about 150–200° C. or so. This would also be true of their alloys, such as strontium-titanate (Sr—Ti), barium-strontium-titanate (Ba—Sr—Ti), lead-zirconium-titanate (Pb—Zr—Ti), etc. This invention recognizes the unique advantages inherent in using processing conditions that produce logarithmic kinetics in the oxidation of appropriately-prepared multilayer stacks of very thin, selected metal and/or alloy films in order to produce multilayer stacks of superior, ultra-thin oxide layers. The composite dielectric layers thus produced will have superior properties, including high capacitance and low leakage, and will be substantially different from those made by other techniques such as MOCVD and reactive sputtering, having a much greater purity, stoichiometric composition, and improved thickness control and uniformity.

By oxidizing a stack of two or more metals which have similar oxidation kinetics and thermodynamics, but which produce oxides with different physical and chemical characteristics, the likelihood of having pinholes, which can promote electrical shorting through the insulator, is greatly reduced.

The formation of the dielectric layer will now be disclosed in more detail, with a number of alternate materials shown.

$Ta_2O_5/Nb_2O_5$ Duplex Dielectric Layer

Figure 3A:
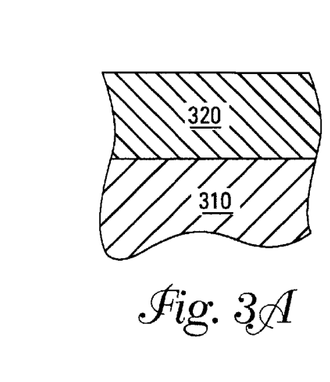
FIGS. 3A, 3B, 3C and 3D are cross-sectional views of duplex layer formation according to one embodiment of the present invention.
Figure 3B:
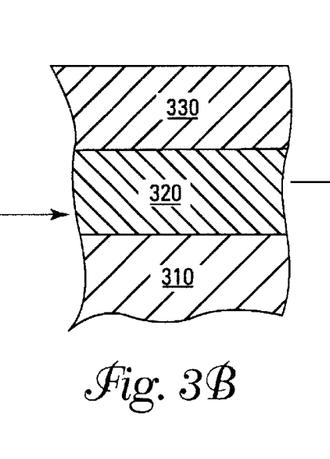

FIGS. 3A, 3B, 3C and 3D show one embodiment of a duplex dielectric layer 300. As seen in FIG. 3A, a continuous, dense, high purity film of tantalum (Ta) 320 is deposited to a precisely-controlled thickness on an appropriate lower electrode plate 310 such as a single crystal silicon substrate or hemispherical grain (HSG) polysilicon substrate (or another plate such as plate 141 of FIG. 2). As described herein, a substrate refers to one or more semiconductor layers or structures which include active or operable portions of semiconductors. A continuous, dense film of niobium (Nb) 330 is then deposited on the tantalum layer 320 to produce the structure shown in FIG. 3B. In one embodiment, the composite metals are oxidized at temperatures under about 200° Centigrade (C) in an oxygen-containing ambient to form layers of tantalum pentoxide ($Ta_2O_5$) 340 and niobium pentoxide ($Nb_2O_5$) 350.

Figure 3C:
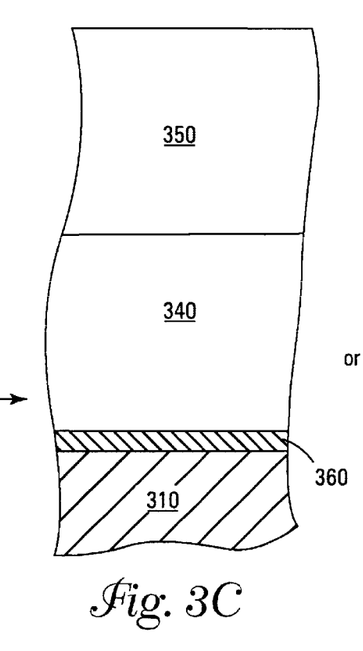

The oxidation parameters for the process are chosen so as to yield a final structure having precisely controlled thicknesses of layers of Ta, $Ta_2O_5$, and $Nb_2O_5$ as shown in FIG. 3C. These goals are achieved in one embodiment by controlling the oxidation time and temperature, provided that the starting Nb and Ta films are prepared with reproducible metallurgical properties. Tantalum and niobium have very similar oxidation rates and oxidation products. This strong similarity is advantageous to the embodiments of the present invention for oxide thickness control purposes. At the same time, the oxides are chemically and structurally different. For example, they have different lattice constants.

The composite oxide structure ($Ta_2O_5/Nb_2O_5$) also serves to reduce the incidence of defects, such as microcracks and the like, which promote shorting and/or other conduction mechanisms. Those rare defects that may develop in the first oxide layer 340 ($Ta_2O_5$) are quite unlikely to continue to grow into the second oxide layer 350 ($Nb_2O_5$). In this embodiment, a double oxide layer, one purpose of which is to achieve improved dielectric integrity, is formed at lower temperature than traditional double oxide layers, and with nearly complete oxidation of the metals. The resulting structure 300 is stoichiometric with predictability and repeatability. Such improvements have been achieved up to now by adding and/or forming a second dielectric layer on a pre-existing first dielectric layer.

In the embodiment shown in FIG. 3C, a very thin residual layer of incompletely oxidized tantalum 360 remains after oxidation. This layer 360 is on the order of a few atom layers thick. It is formed of a tantalum oxygen solid solution, tantalum suboxides, or combinations thereof (Ta—O). This layer or skin 360 serves in one embodiment to protect the underlying substrate from accidental oxidation. Another function the layer serves is improvement of $Ta_2O_5$ adhesion to the substrate. The Ta—O layer 360 is formed within the time frame for complete oxidation of the niobium without conversion of the layer 360.

Figure 3D:
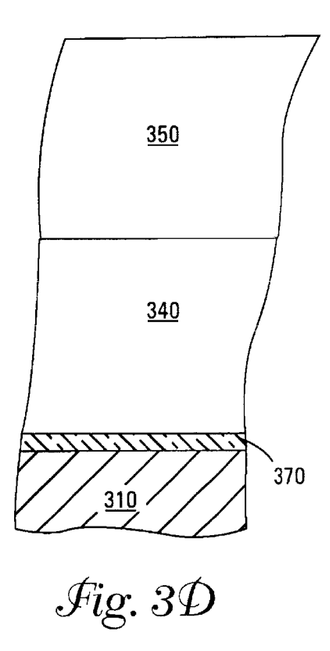

In another embodiment shown in FIG. 3D, the oxidation process continues for a predetermined sufficient time so as to completely oxidize the layer 360 to form new layer 370, which is in one embodiment silicon dioxide ($SiO_2$). In this embodiment, with the properly controlled oxidation time, minimal oxidation of the underlying substrate occurs. In any event, the amount of oxidation of the underlying substrate 310 is insufficient to affect the properties of the structure 300. Also, due to low temperatures used in the process, and the refractory nature of the starting metals, the as-deposited metal layers will not inter-diffuse to any extent that would complicate oxidation kinetics.

This dielectric layer 300, in one embodiment, is formed in a single-wafer cluster system in order to carry out the necessary processes under adequate vacuum, cleanliness, and other conditions It is not essential, however, to use a cluster system. One process sequence is discussed below. The process assumes that appropriate capacitor plates are already available. These capacitor plates can be hemispherical grain polysilicon (HSG), doped single crystal silicon, or various metals or suicides.

In one embodiment, a silicon wafer is transferred to Chamber I of the cluster tool, and the surface of the wafer is sputter cleaned with inert gas ions. The wafer is heated to a predetermined temperature sufficient to produce a dense and highly pure deposited film of tantalum, in one embodiment having a thickness of approximately 10 to 50 angstroms. To achieve uniform tantalum thickness, in another embodiment more sophisticated sputtering techniques, such as S-gun sources in combination with planetary substrate movements, are used.

The wafer is then transferred to chamber II of the cluster tool, and a high purity dense layer of niobium is deposited on the tantalum layer. In one embodiment, the tantalum is deposited to a thickness of about 10 to 20 angstroms. Oxygen is added to the chamber and the composite metals are oxidized under conditions sufficient to fully oxidize the metals to $Ta_2O_5$ and $Nb_2O_5$ layers. The Nb layer will be oxidized virtually to completion first, then followed by oxidation of the Ta layer.

In one embodiment, as described above, a very thin layer of partially oxidized or unreacted tantalum is left at the substrate tantalum junction. The thickness of untreated Ta must not be so large as to allow the development of a significant suboxide layer which might serve to reduce the stoichiometry of the $Ta_2O_5$ layer, but will tend to be on the order of a few angstroms. A Ta—O solid solution develops in the underlying, unoxidized Ta but, as discussed above, this presents no complications or degradation of function in the resulting structure.

Thermodynamic forces strongly drive the compositions of the two pentoxides to their stoichiometric compositions, provided the thickness of the unoxidized Ta—O solid solution is kept relatively small. In one embodiment, the unoxidized thickness is equivalent to less than 5 atomic layers of pure metal. Such a structure will be referred to herein as having "substantially no" unoxidized metal thickness. This is an improvement over the thermodynamic situation where oxides of Ta and oxides of Nb are formed in gaseous and/or plasma states, as these systems have relatively weak tendencies to form stoichiometric metal pentoxides and require subsequent high temperature oxygen post-treatments to achieve stoichiometry. These other processes also tend to incorporate impurities and produce oxide films far from their thermodynamically optimal states, leading to much greater variations in the control of oxide thicknesses.

Ten angstroms of Ta, completely oxidized, yields 25 angstroms of $Ta_2O_5$ under normal conditions, i.e., at 100 mTorr or more pressure. Ten angstroms of Nb, completely oxidized, will yield 27 angstroms of $Nb_2O_5$ under normal conditions, i.e., at 100 mTorr or more pressure. In one embodiment, oxidation is performed at 200–300° C. (in another embodiment at 270° C.) in dry oxygen at 70–760 Torr. The Nb layer will be oxidized virtually to completion first, and oxidation of the Ta layer follows.

In other embodiments, the wafer is transferred to chamber III of the cluster tool and exposed to oxygen plasma to increase permittivity, and transferred to chamber IV of the cluster tool for deposition of a top electrode. Alternatively, the addition of a top electrode is completed external to the cluster system.

In another embodiment, the metals are oxidized separately. A dense high purity Ta layer is formed, the tantalum layer is oxidized at a temperature in one embodiment of below about 150 degrees C. to produce $Ta_2O_5$. In one embodiment, an exceedingly thin partially oxidized Ta—O skin as discussed above is left in contact with the substrate. Following that a dense high purity layer of niobium is deposited on the $Ta_2O_5$ layer, and is completely oxidized.

While the various embodiments above have been described with respect to a cluster system, in other embodiments, some or all of the processes are carried out using more conventional vacuum deposition and oxidation systems. For example, and not by way of limitation, multiple metal film deposition is in one embodiment accomplished in the same chamber using multiple metal targets, such as S-guns and the like.

In another embodiment, cleaning such as sputter cleaning is accomplished in an inter gas plasma to remove native oxides and impurities. Such a process is in another embodiment performed in a metal deposition system with the introduction of an electrode to excite the plasma. Other embodiments will be readily apparent to those of ordinary skill in the art, and are within the scope of the present invention.

Further, the oxidation processes of the various embodiments are accomplished in other embodiments either in a chamber connected to the deposition chamber or outside of the deposition chamber using a conventional oxidation furnace or system.

In another embodiment, a brief high-temperature (on the order of 700–800 degrees C.) anneal is utilize to crystallize the oxides and therefore substantially increase their dielectric constants. Such heat treatments are done in inert ambients, including vacuum, argon, neon, nitrogen, and the like in one embodiment. These processes offer advantages over earlier approaches such as MOCVD oxides which must be heat treated in an oxidizing ambient in order to convert the deposited oxides to stoichiometric compositions, to remove carbon impurities, and the like.

The oxidation characteristics of the relevant materials used in the various embodiments, including silicon, tantalum, niobium, and the like allow the use of stoichiometric oxides in an oxidizing ambient at low temperatures with no attendant silicon oxidation, and then allow conversion of the resulting vitreous or amorphous oxides to their crystalline forms using a high temperature, inert ambient anneal to achieve maximum attainable dielectric constants for the oxide layers involved.

Figure 4:
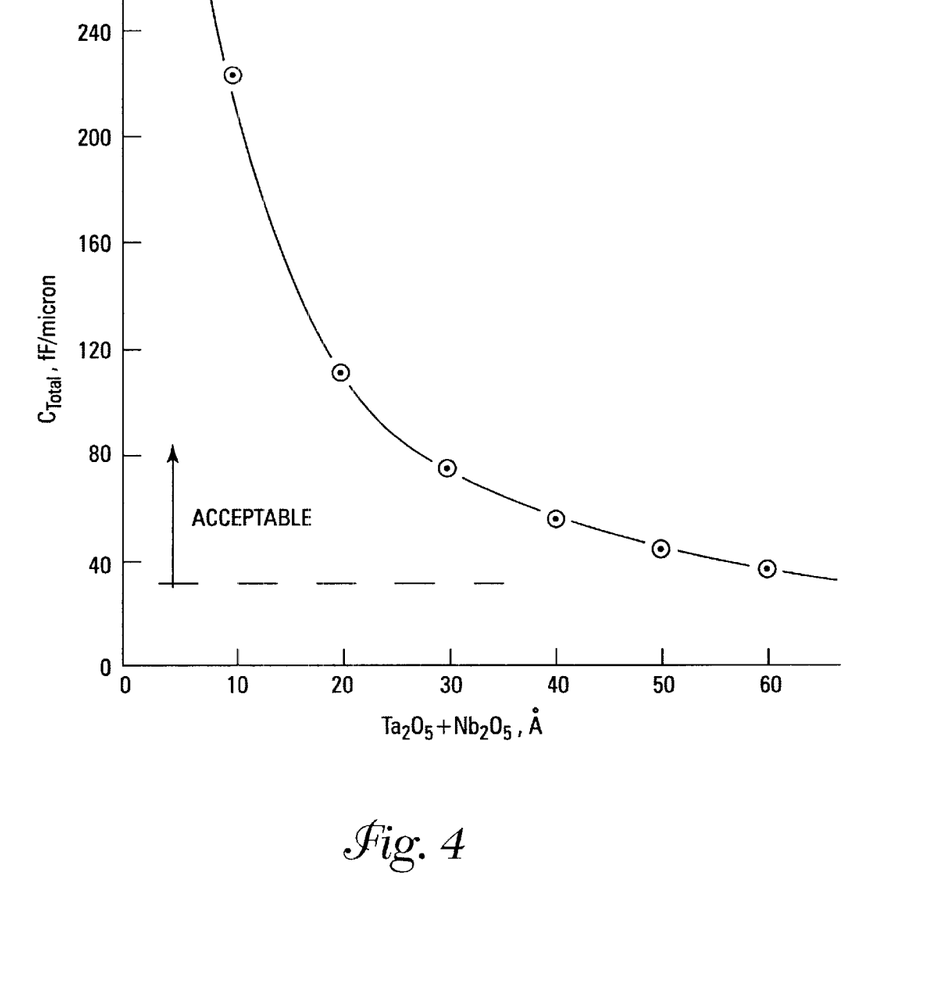
FIG. 4 shows capacitance estimates for $Ta_2O_5/Nb_2O_5$ dielectrics having total thicknesses between 10 and 60 angstroms.

FIG. 4 shows a graph of the projected total capacitances of a capacitor using a duplex layer of $Ta_2O_5$ and $Nb_2O_5$, where the x-axis is the thickness of dielectric in angstroms, and the y-axis is the total capacitance in femtoFarads (fF) per micron. The assumptions used are that the dielectrics are grown on a capacitor plate of doped silicon or metal that has an actual area equal to the nominal area and that the dielectric constants of Ta and Nb pentoxides are equal, with a value of 25.

In a further embodiment, niobium is the first deposited layer, with tantalum deposited on top of it.

$Si_3N_4/Ta_2O_5$ Duplex Dielectric Layer

In another embodiment, a process for forming a duplex dielectric layer comprises a similar general process to that described above. Using a doped silicon or HSG polysilicon wafer, in one embodiment in a single wafer cluster tool as described above, a mixture of $N_2$ and $NH_3$ gases are introduced to produce a steady state pressure on the order of $10^{-2}$ to 1 Torr (Hg). Sufficient radio frequency (rf) power is introduced into chamber I of the cluster tool so as to cause nitridation of the silicon. In one embodiment, the rf power is in a frequency range of approximately 1 kHz to 13.57 MHz. Nitridation rate depends on the rf power and frequency, cathode voltage, temperature, system configuration, and the like. In another embodiment, an inert gas is included with the $N_2$ and $NH_3$ gases to increase the sputtering rate.

Upon termination of nitridation, the chamber is evacuated and the wafer is held at a predetermined temperature for a predetermined time to allow the formed $Si_3N_4$ to attain stoichiometry by reacting excess nitrogen with the silicon.

The wafer is transferred to chamber II of the cluster tool, where a layer of tantalum is sputter deposited with a thickness in one embodiment of approximately 5 to 25 angstroms. This tantalum layer is oxidized for sufficient time to completely convert the tantalum to $Ta_2O_5$. In another embodiment, the oxidation time of the tantalum is extended a sufficient time so as to allow oxygen ions to reach and to oxidize an ultra-thin layer of the underlying $Si_3N_4$, or nitride microcracks that may develop during processing, or both.

Figure 5A:
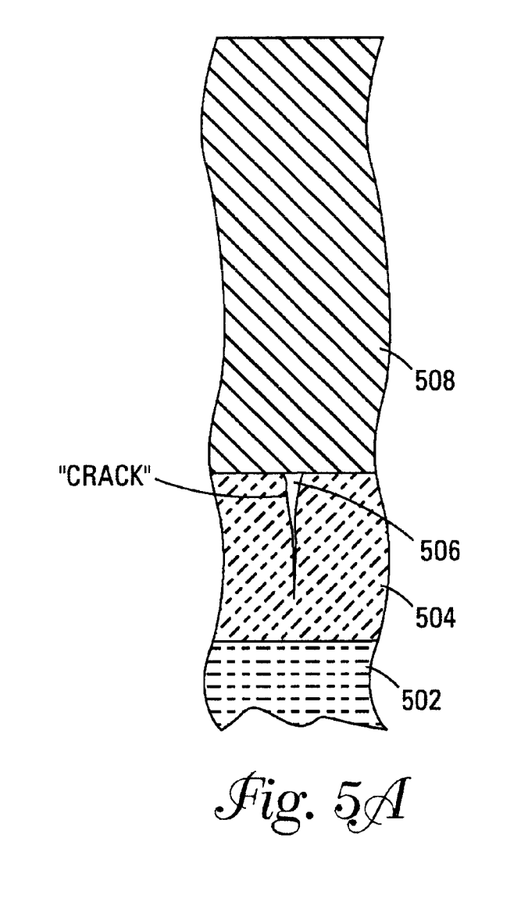
FIGS. 5A and 5B show an embodiment of a method for sealing a microcrack in a multilayer dielectric.
Figure 5B:
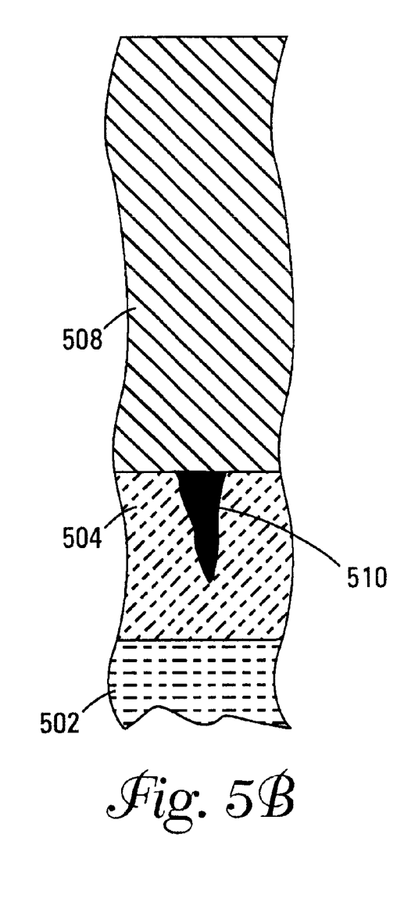

A microcrack oxidation is shown in greater detail in FIGS. 5A and 5B. A silicon substrate 502 has formed thereon by one of the processes described above a $Si_3N_4$ layer 504. This layer 504 has a microcrack 506 formed in it during the nitridation or oxidation processes. When oxidation of the tantalum layer 508 is complete, the oxidation time is extended to allow use of the flux of oxygen ions that can pass slowly through the $Ta_2O_5$ to oxidize the exposed surface of the microcrack 506 to form $SiO_2$ fill 510, filling the microcrack 506.

As described above, further processes are performed in the cluster tool in one embodiment, or placement of the top electrode is accomplished in another embodiment external to the cluster tool.

$Ta/Ta_2O_5/SrTiO_3$ Duplex Dielectric Layers

In another embodiment, yet another different duplex dielectric layer is formed with different metals. The process for formation of this duplex layer embodiment is similar to those embodiments described above. However, the niobium layer is replaced with a sputtered layer of $Sr_{0.5}Ti_{0.5}$. The oxidation parameters needed to achieve the final structure are different but readily determinable.

In addition, the processes described above are suitable for the formation of many different oxides, alone or in composite dielectric structures. Other high dielectric constant oxides, listed by way of example only and not by way of limitation, include $TiO_2$, $ZrO_2$, $SrO$, $Fe_2O_3$, $Fe_3O_4$, and $CoO$.

In a further alternate embodiment, alloys of Nb and Ta can be used in combination with one another or with unalloyed layers of Nb and Ta to form the desired dielectric layers. Examples of other alloying elements that could be added to the Nb and Ta include vanadium (V), thorium (Th), cobalt (Co), zirconium (Zr), titanium (Ti), chromium (Cr), tungsten (W), silicon (Si), nickel (Ni), and molybdenum (Mo).

$Ta/Ta_2O_5/SrTiO_3/Nb_2O_5$ Triplex Dielectric Layer

In yet another embodiment, three separate dielectrics are formed using substantially the same processes described above. The oxidation uses in this embodiment layers of tantalum, $Sr_{0.5}Ti_{0.5}$, and niobium. The oxidation parameters and processes are more complex than the above processes, but are readily obtainable using the direction provided above. Advantages to the use of the triplex dielectric layer include by way of example and not limitation, reduced electrical defects due to three distinct oxides, and wider latitude in selection of top electrode metallurgy. The reduced electrical defects are due to a lower probability of formation of overlapping defects in the trilayer arrangement. In order to maintain high cell capacitances, in one embodiment, thinner dielectric layers are used.

In the various embodiments described above, thermal oxidation at 200–300 degrees C. as opposed to the much higher temperatures of previous or alternative processes results in a dielectric structure that is stoichiometric and fully oxidized without contamination. Therefore, no burning off of contaminants is necessary as in high temperature processes. The low temperature embodiments described herein are performed in alternative embodiments in almost any inert gas, such as Nitrogen, Argon, and the like.

The oxide films grown by the processes described above are as pure as the metal films themselves, and are free of organic and other contaminants. The dielectric constants of the oxide films grown are on the order of 20 or more. Oxides grown on alloys such as Ba—Sr—Ti will tend to crystallize with a perovskite structure with dielectric constants >>20, depending on the preferred orientation developed during growth, among other factors.

Figure 6:
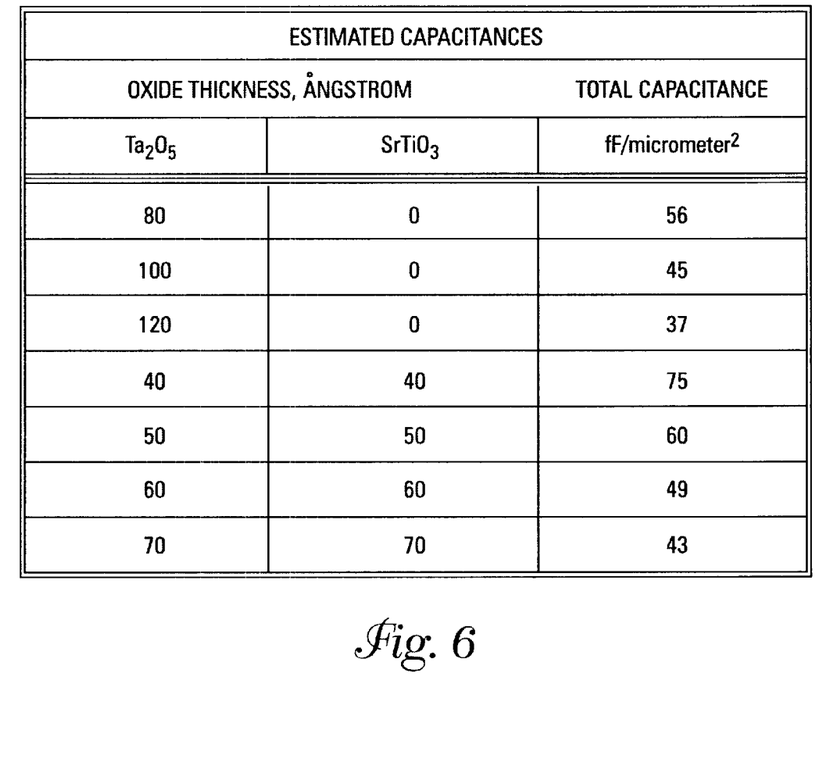
FIG. 6 is a table of estimated capacitances for some of the disclosed embodiments of the invention.

Accordingly, the table of FIG. 6 gives an estimate of the total capacitances achievable with these dielectric layers on an HSG polysilicon bottom electrode. These estimates were based on capacitors built on HSG polysilicon with an actual area about 200% larger than the nominal value. The $Ta_2O_5$ film was conservatively assumed to have a dielectric constant of 20. Much more conservatively, $SrTiO_3$ was assumed to have a dielectric constant of 40.

The structures formed using the various embodiments described above have high capacitances and low leakage current as well. Capacitance of structures obtained by the methods described above are much greater than 30 $pF/micrometer^2$, and leakage currents are less than $10^{-14}$ $amps/micrometer^2$.

Figure 7:
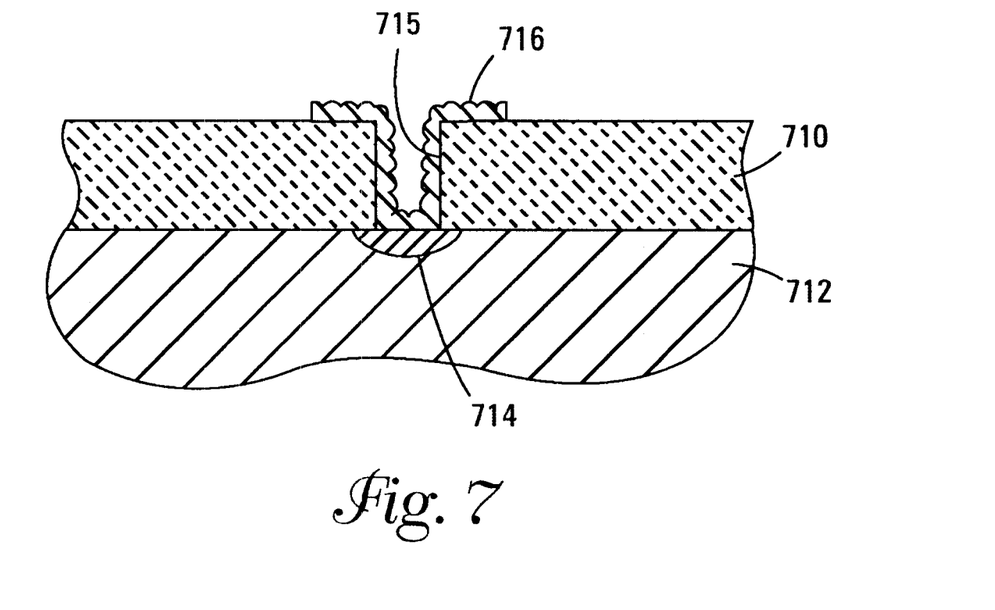
FIG. 7 is a partial elevation view of a cross section of a capacitor formed with hemispherical grained polysilicon (HSG) as a bottom electrode.

In a further embodiment employing HSG as the electrode material, shown in FIG. 7, a capacitor prior to the deposition of the capacitor dielectric is shown. In this figure, interlevel dielectric 710 has been deposited over a substrate 712 which includes contact region 714 for a capacitor, and a hole 715 has been etched through dielectric 710 for construction of the capacitor. A layer of HSG 716 has been formed and patterned as shown. When the Ta is deposited to form the capacitor dielectric, sophisticated sputtering approaches, such as S-gun sources in combination with planetary substrate movements, can help to achieve a uniform Ta thickness on the rough surface of the HSG.

In further embodiments, electrodes of the capacitor are formed in other manners, such as the deposition of amorphous silicon, which is then converted to polysilicon by later processing.

In another embodiment, the oxidation step of the above dielectric forming process can use various oxidants including oxygen, ozone, and gaseous water and combinations of the same.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A method of forming a dielectric layer, comprising:
    forming a first metallic layer above a substrate;
    oxidizing the metallic layer to form a first dielectric oxide;
    forming a second metallic layer of a different metal above the first oxidized layer; and
    oxidizing the second metallic layer to form a second dielectric oxide different from the first dielectric oxide.

2. The method of claim 1, wherein the first metallic layer is high purity tantalum.

3. The method of claim 1, wherein oxidation of the first metallic layer is accomplished at a temperature of less than about 150 degrees C.

4. The method of claim 1, wherein oxidation of the first metallic layer leaves a thin skin of incompletely oxidized first metallic layer separating the first dielectric oxide and the substrate.

5. The method of claim 1, wherein the second metallic layer is niobium.

6. The method of claim 1, wherein the first metallic layer is niobium and the second metallic layer is tantalum.

7. A method of forming a dielectric layer, comprising:
    forming a first metallic layer above a substrate;
    forming a second metallic layer different than the first metallic layer above the first metallic layer; and
    oxidizing the first and the second metallic layers to form first and second dielectric oxide layers that are substantially stoichiometric.

8. The method of claim 7, wherein oxidizing fully oxidizes the second metallic layer and substantially fully oxidizes the first metallic layer leaving a thin partially oxidized layer between the first metallic layer and the substrate.

9. The method of claim 7, wherein oxidizing is accomplished at a temperature less than about 200 degrees C.

10. The method of claim 7, wherein the first metallic layer is tantalum.

11. The method of claim 7, wherein the second metallic layer is niobium.

12. The method of claim 7, wherein the substrate is HSG polysilicon.

13. The method of claim 7, wherein the substrate is doped single crystal silicon.

14. The method of claim 7, wherein oxidizing fully oxidizes the first and the second metallic layers each to a stoichiometric dielectric oxide having high oxygen content.

15. A process for forming a dielectric layer in a cluster system having at least first and second chambers, comprising:
    cleaning a surface of a wafer in the first chamber;
    forming a first metallic layer above the cleaned surface;
    oxidizing the first metallic layer for a predetermined time to substantially completely oxidize the first metallic layer to a first dielectric oxide;
    transferring the wafer to the second chamber;
    forming a second metallic layer above the first dielectric oxide; and
    oxidizing the second metallic layer completely to a second dielectric oxide.

16. The method of claim 15, wherein the second oxidizing further comprises oxidizing beyond a predetermined first oxidation time to completely oxidize first metallic layer.

17. The method of claim 15, wherein oxidizing the first metallic layer further comprises leaving a thin partially oxidized layer between the first dielectric oxide and the substrate.

18. The method of claim 15, wherein the first metallic layer is a tantalum layer deposited to a thickness of approximately 10 to 50 angstroms.

19. The method of claim 15, wherein the second metallic layer is a niobium layer deposited to a thickness of approximately 10 to 25 angstroms.

20. The method of claim 15, wherein oxidizing the first metallic layer is accomplished at a temperature of less than about 150 degrees C.

21. The method of claim 15, wherein oxidizing the second metallic layer is accomplished at a temperature of less than about 200 degrees C.

22. A process for forming a dielectric layer in a cluster system having at least first and second chambers, comprising:
    cleaning with inert gas ions a surface of a wafer in the first chamber;
    forming a first metallic layer above the cleaned surface;
    oxidizing the first metallic layer for a predetermined time to substantially completely oxidize the first metallic layer to a first dielectric oxide;
    transferring the wafer to the second chamber;
    forming a second metallic layer above the first dielectric oxide; and
    oxidizing the second metallic layer completely to a second different dielectric oxide.

23. A process for forming a dielectric layer, comprising
    sputter cleaning with inert gas ions a surface of a wafer in a first chamber of a cluster system;
    depositing a first metallic layer on the cleaned surface;
    oxidizing the first metallic layer for a predetermined time to substantially completely oxidize the first metallic layer to a first dielectric oxide;
    transferring the wafer to a second chamber of the cluster system;
    depositing a second metallic layer over the first dielectric oxide; and
    oxidizing the second metallic layer completely to a second different dielectric oxide.

24. The method of claim 23, and further comprising:
    transferring the wafer to a third chamber of the cluster system; and
    exposing the wafer to an oxygen plasma to increase permittivity.

25. A method for forming a duplex dielectric layer, comprising:
    sputter cleaning with inert gas ions a surface of a wafer in a first chamber of a cluster system;
    depositing a first metallic layer on the cleaned surface;
    depositing a second metallic layer different from the first metallic layer over the first metallic layer; and
    oxidizing the first metallic layer substantially completely and the second metallic layer completely to different dielectric oxides.

26. The method of claim 25, wherein oxidizing is performed using two different oxidizing target sources.

27. The method of claim 25, wherein the sources are S-guns.

28. A method for forming a duplex dielectric layer on a wafer substrate, comprising:
    transferring the wafer to a first chamber of a cluster system;
    evacuating the first chamber to a predetermined vacuum level;
    heating the wafer to a predetermined temperature in a nitridation range of 300–600 degrees C.;
    introducing a mixture of gases to the chamber to produce a predetermined steady state total pressure;
    applying radio frequency power to cause nitridation of the wafer substrate;
    reevacuating the first chamber;
    permitting nitridation for a predetermined time to create a stoichiometric nitride layer on the substrate;
    transferring the wafer to a second chamber of the cluster system;
    depositing a metallic layer on the nitride layer; and
    oxidizing the metallic layer to a dielectric oxide.

29. The method of claim 28, and further comprising:
    sealing a microcrack present in the nitride layer.

30. The method of claim 29, wherein sealing a microcrack comprises:
    oxidizing the dielectric layer beyond a complete oxidation time to use the flux of oxygen ions to oxidize a surface of the microcrack.

31. The method of claim 28, wherein the radio frequency power is applied within a frequency range of approximately 1 kHz to 13.57 MHz.

32. A method of forming a trilayer dielectric, comprising:
    forming a nitride layer on a substrate; and
    forming in the same oxidation process first and second metallic oxide layers on the nitride layer, wherein the first and second dielectric oxide layers are formed at a temperature less than about 200 degrees C.

33. A method of forming a trilayer dielectric, comprising:
    forming in the same oxidation process first, second and third metallic oxide layers on a substrate at a temperature less than about 200 degrees C.

34. A dielectric layer, comprising:
    an ultrathin partially oxidized layer;
    a first stoichiometric dielectric oxide layer; and
    a second stoichiometric dielectric oxide layer of different composition than the first dielectric oxide layer, wherein the first and the second oxide layers are formed in a single oxidation process.

35. A method of forming a passivation layer, comprising:
    depositing first metallic layer on a substrate;
    depositing second metallic layer of different composition than first metallic layer on first metallic layer;
    oxidizing first metallic layer and second metallic layers to dielectric oxides, wherein first metallic layer leaves an ultrathin passivation layer between the substrate and the first dielectric oxide layer.

36. An integrated circuit structure, comprising:
    a first high-k metallic oxide layer having a stoichiometrically pure composition with essentially no suboxides; and a second high-k metallic oxide layer overlaying the first layer and different from the first layer and stoichiometrically pure with substantially no suboxides.

37. A method of making a high dielectric constant dielectric layer for an integrated circuit, comprising:
    depositing a first metallic layer on an integrated circuit structure with a uniform thickness less than 100 angstroms; and
    oxidizing the first metallic layer at a temperature less than about 300 degrees C. to produce a stoichiometrically pure layer of metallic oxide; and
    depositing a second metallic layer of a different composition than the first metallic layer between depositing the first metallic layer and oxidizing, and wherein oxidizing also oxidizes the second metallic layer to a stoichiometrically pure layer of a different metallic oxide.

38. A method of fabricating a capacitor, comprising:
    forming a first capacitor electrode electrically connected to a semiconductor substrate;
    depositing a first metal layer overlying the first capacitor electrode;
    depositing a second metal layer different from the first metal layer over the first metallic layer;
    oxidizing the first and the second metal layers at a temperature less than about 300 degrees C. until the first metallic layer is substantially completely oxidized and the second metallic layer is completely oxidized; and
    forming a second capacitor electrode overlying the oxidized layers.

39. The method of claim 38, and further comprising:
    depositing a third metal layer over the first and the second metal layers before oxidizing.

40. A capacitor, comprising:
    first and second electrodes of a conductive material; and
    a capacitor dielectric layer separating the first and the second electrodes, the capacitor dielectric comprising a first high dielectric constant metallic oxide layer having a stoichiometrically pure composition with essentially no suboxides, and a second high dielectric constant metallic oxide layer having a stoichiometrically pure composition different from the first metallic oxide layer.

41. The capacitor of claim 40, and further comprising:
    an ultrathin partially oxidized metallic layer between the first metallic oxide layer and one of the first or the second electrodes.

42. A capacitor, comprising:
    first and second electrodes of a conductive material; and
    a capacitor dielectric separating the first and the second electrodes, the dielectric comprising a first layer of $Ta_2O_5$ and a second layer of $Nb_2O_5$.

43. A memory chip, comprising:
    an array of transistors; and
    an array of capacitors corresponding to the array of transistors, each capacitor comprising:
    a first electrode of a conductive material electrically connected to a semiconductor substrate;
    a second electrode of conductive material; and
    a dielectric layer separating electrodes, the dielectric layer comprising a first high dielectric constant metallic oxide layer of a first composition and a second high dielectric constant metallic oxide layer of a second composition, wherein the first and the second layers are formed in a single oxidation process.

44. The memory chip of claim 43, wherein the dielectric layer further comprises:

a third high dielectric constant metallic oxide layer of a third composition, wherein the third later is formed in the single oxidation process.

45. A method of fabricating a memory chip, comprising:

forming an array of transistors on a semiconductor substrate;

forming an array of capacitor electrodes which are electrically connected to be controlled by a respective one of the array of transistors;

depositing a layer of a first metal overlying the first capacitor electrode;

depositing a layer of a second metal over the layer of first metal;

oxidizing the first and the second metal layers to two different dielectric oxide layers; and forming a second array of capacitor electrodes over the oxidized layers.

46. A method for sealing a microcrack in a nitride layer below a multiple metallic layer stack during oxidation of the stack to a multiple layer dielectric, comprising:

oxidizing the multiple metallic layer stack beyond a complete oxidation time to use a flux of oxygen ions to oxidize a surface of the microcrack.

* * * * *

UNITED STATES PATENT AND TRADEMARK OFFICE
CERTIFICATE OF CORRECTION

PATENT NO.    : 6,461,931 B1
DATED         : October 8, 2002
INVENTOR(S)   : Jerome M. Eldridge It is certified that error appears in the above-identified patent and that said Letters Patent is hereby corrected as shown below:

Column 5,
Line 25, replace "suicides" with -- silicides --.

Signed and Sealed this

Sixth Day of May, 2003

JAMES E. ROGAN
*Director of the United States Patent and Trademark Office*